(12) United States Patent
Shie et al.

(10) Patent No.: US 11,836,376 B2
(45) Date of Patent: Dec. 5, 2023

(54) CONVOLUTION TIME DE-INTERLEAVER AND METHOD FOR OPERATING A CONVOLUTION TIME DE-INTERLEAVER

(71) Applicant: REALTEK SEMICONDUCTOR CORPORATION, Hsinchu (TW)

(72) Inventors: Yi-Lin Shie, Hsinchu (TW); Wen-Tsai Liao, Hsinchu (TW); Lili Tan, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/844,783

(22) Filed: Jun. 21, 2022

(65) Prior Publication Data
US 2022/0413747 A1 Dec. 29, 2022

(30) Foreign Application Priority Data
Jun. 23, 2021 (CN) .......................... 202110697483.5

(51) Int. Cl.
*G06F 3/06* (2006.01)

(52) U.S. Cl.
CPC .......... *G06F 3/0655* (2013.01); *G06F 3/0604* (2013.01); *G06F 3/0673* (2013.01)

(58) Field of Classification Search
None
See application file for complete search history.

(56) References Cited

U.S. PATENT DOCUMENTS 6,411,654 B1 * 6/2002 Furutani ........... H03M 13/6502
375/265

* cited by examiner

*Primary Examiner* — Charles J Choi
(74) *Attorney, Agent, or Firm* — WPAT, P.C., INTELLECTUAL PROPERTY ATTORNEYS; Anthony King (57) ABSTRACT

A convolution time de-interleaver includes an input buffer, an output buffer, a memory, an input control circuit, an output control circuit, and a controller. The memory includes a plurality of memory blocks. The input control circuit sequentially outputs a plurality of entries of data to a plurality of input register unit groups of the input buffer respectively and correspondingly. After a predetermined amount of data have been written to the input buffer, the controller writes part of data stored in the input buffer to a corresponding memory block. After the plurality of memory blocks are written, the controller writes data stored in a corresponding memory block to the output buffer. The output control circuit sequentially outputs a plurality of pieces of data stored in a plurality of output register unit groups of the output buffer.

20 Claims, 8 Drawing Sheets

CONVOLUTION TIME DE-INTERLEAVER AND METHOD FOR OPERATING A CONVOLUTION TIME DE-INTERLEAVER

CROSS-REFERENCE TO RELATED APPLICATIONS

This application claims priority of China application No. 2021106974835, filed on Jun. 23, 2021, which is incorporated by reference in its entirety.

TECHNICAL FIELD

The present application relates to a convolution time de-interleaver, particularly a convolution time de-interleaver capable of using the memory bandwidth efficiently.

BACKGROUND

Figure 1:
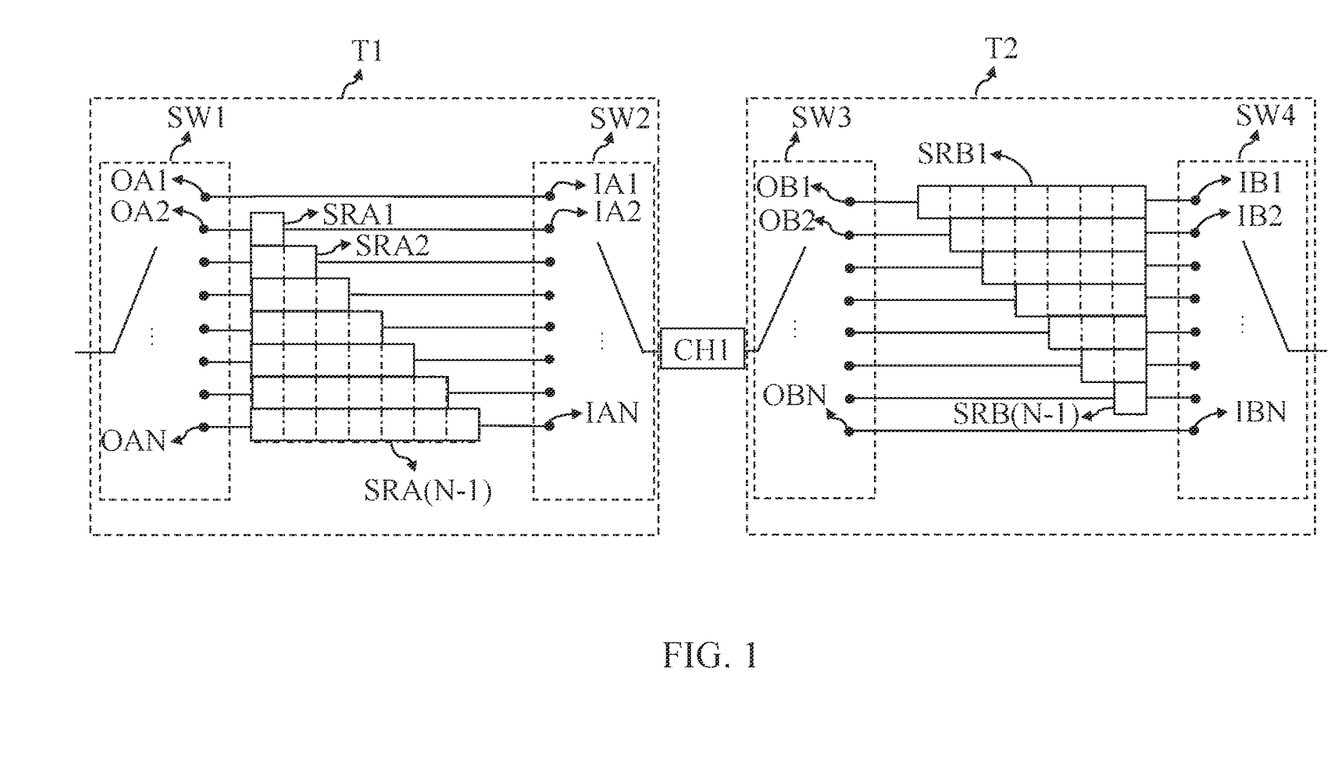
FIG. 1 is a schematic diagram illustrating a convolution time interleaver and a convolution time de-interleaver.

In the Advanced Television Systems Committee (ATSC) version 3.0 specification, the physical layer used to transmit and receive signals uses the time interleave mechanism to increase immunity of the signal transmission against burst error. FIG. 1 is a schematic diagram illustrating a convolution time interleaver (CTI) T1 and a convolution time de-interleaver (CTDI) T2.

The convolution time interleaver T1 may include switching circuits SW1 and SW2 and (N−1) shift register groups SRA1 to SRA(N−1), wherein N is an integer greater than 1. Each of the shift register groups SRA1 to SRA(N−1) may include a different number of shift registers to provide different lengths of delay. The switching circuit SW1 has N output terminals OA1 to OAN, and the output terminals OA2 to OAN of the switching circuit SW1 are respectively coupled to a corresponding shift register group of the (N−1) shift register groups SRA1 to SRA(N−1). The switching circuit SW2 has N input terminals IA1 to IAN, and the input terminals IA2 to IAN of the switch circuit SW2 are respectively coupled to a corresponding shift register group in the (N−1) shift register groups SRA1 to SRA(N−1), and the input terminal IA1 of the switching circuit SW2 is coupled to the output terminal OA1 of the switching circuit SW1.

When the convolution time interleaver T1 transmits continuous data, the switching circuit SW1 sequentially transmits the data through the output terminals OA1 to OAN, whereas the switching circuit SW2 sequentially receives the data through input terminals IA1 to IAN and outputs the received data to an external transmission channel CH1. Because the (N−1) shift register groups SRA1 to SRA(N−1) can provide different lengths of delay, the transmission sequence of continuous data is rearranged and will interleave with other data. Consequently, when burst error occurs in the transmission channel, it will not cause errors in the entire continuous data, and the correct data can still be obtained using an automatic error correction mechanism.

The convolution time de-interleaver T2 can include switching circuits SW3 and SW4 and (N−1) shift register groups SRB1 to SRB(N−1). Each of the shift register groups SRB1 to SRB(N−1) can include different numbers of shift registers to provide different lengths of delay. The switching circuit SW3 has N output terminals OB1 to OBN, the output terminals OB1 to OB(N−1) of the switching circuit SW3 are respectively coupled to a corresponding shift register group in the (N−1) shift register groups SRB1 to SRB(N−1). The switching circuit SW4 has N input terminals IB1 to IBN, and the input terminals IB1 to IB(N−1) of the switching circuit SW4 are respectively coupled to a corresponding shift register group in the (N−1) shift register groups SRB1 to SRB(N−1), whereas the input terminal IBN of the switching circuit SW4 is coupled to the output terminal OBN of the switching circuit SW3.

When the convolution time de-interleaver T2 receives data transmitted via the channel CH1, the switching circuit SW3 sequentially transmits the data through the output terminals OB1 to OBN to (N−1) shift register groups SRB1 to SRB(N−1) and the input terminal IBN of the switching circuit SW4, whereas the switching circuit SW4 sequentially receives the data through input terminals IB1 to IBN and outputs the data. Because the (N−1) shift register groups SRB1 to SRB(N−1) can provide different lengths of delay, the convolution time de-interleaver T2 may rearrange the order of the data back to the original continuous order received by the switching circuit SW1.

However, the shift registers SRA1 to SRA(N−1) in the convolution time interleaver T1 and the shift registers SRB1 to SRB(N−1) in the convolution time de-interleaver T2 require a large amount of circuit area and higher hardware cost. In addition, in the convolution time de-interleaver T2, if the shift registers are replaced by a memory that has higher utilizing efficiency and lower hardware cost, the bandwidth of the memory may be wasted due to the discontinuity of the write addresses, and the time required for outputting each data may even increase, resulting in system inefficiency.

SUMMARY OF THE INVENTION

One embodiment of the present disclosure provides a convolution time de-interleaver. The convolution time de-interleaver comprises an output buffer, an input buffer, a memory, an input control unit, a output control unit, and a controller.

The output buffer comprises H first output register unit groups, and each first output register unit group comprises W first output register units, wherein H and W are integers greater than 1. The input buffer comprises H first input register unit groups corresponding to the H first output register unit groups, wherein a quantity of first input register units in an $h^{th}$ first input register unit group is equal to a sum of W and H minus h, and h is a positive integer less than or equal to H. The memory comprises K first memory blocks, each first memory block comprises H first memory unit groups corresponding to the H first output register unit groups and the H first input register unit groups, and each first memory unit group comprises W first memory units, wherein K is a positive integer. The input control unit sequentially writes H entries of input data to the H first input register unit groups correspondingly. The output control unit sequentially outputs H entries of output data stored in the H first output register unit groups. After writing one entry of input data to each of the H first input register unit groups for W times, the controller writes data stored in W first input register units that have not been written for the longest time in each of the first input register unit groups to a corresponding first memory unit group of a first memory block having a priority write order. After writing H times W entries of data to each of the K first memory blocks, the controller writes data stored in a first memory block having a priority read order to the H first output register unit groups of the output buffer. Each first output register unit, each first input register unit, and each first memory unit have a same bit capacity. A bit capacity of each first memory block is an integer multiple of a single read/write bandwidth of the memory.

Another embodiment of the present disclosure provides a method for operating a convolution time de-interleaver. The convolution time de-interleaver comprises an output buffer, an input buffer, and a memory. The output buffer comprises H first output register unit groups, and each first output register unit group comprises W first output register units. The input buffer comprises H first input register unit groups corresponding to the H first output register unit groups, and a quantity of first input register units in an $h^{th}$ first input register unit group being equal to a sum of W and H minus h, wherein h is a positive integer less than or equal to H. The memory comprises K first memory blocks, each first memory block comprises H first memory unit groups corresponding to the H first output register unit groups and H first input register unit groups, and each first memory unit groups comprises W first memory units. Each first output register unit, each first input register unit, and each first memory unit have a same bit capacity, and a bit capacity of each first memory block is an integer multiple of a single read/write bandwidth of the memory, wherein H and W are integers greater than 1, K is a positive integer, and h is a positive integer less than or equal to H.

The method comprises sequentially writing H entries of input data to the H first input register unit groups correspondingly, when sequentially writing the H entries of input data to the H first input register unit groups correspondingly, sequentially outputting H entries of output data stored in the H first output register unit groups at the same time, after writing one entry of input data to each of the H first input register unit groups for W times, writing data stored in W first input register units that have not been written for the longest time in each of the first input register unit groups to a corresponding first memory unit group of a first memory block having a priority write order, and after writing H times W entries of data to each of the K first memory blocks, writing data stored in a first memory block having a priority read order to the H first output register unit groups of the output buffer.

DETAILED DESCRIPTION

Figure 2:
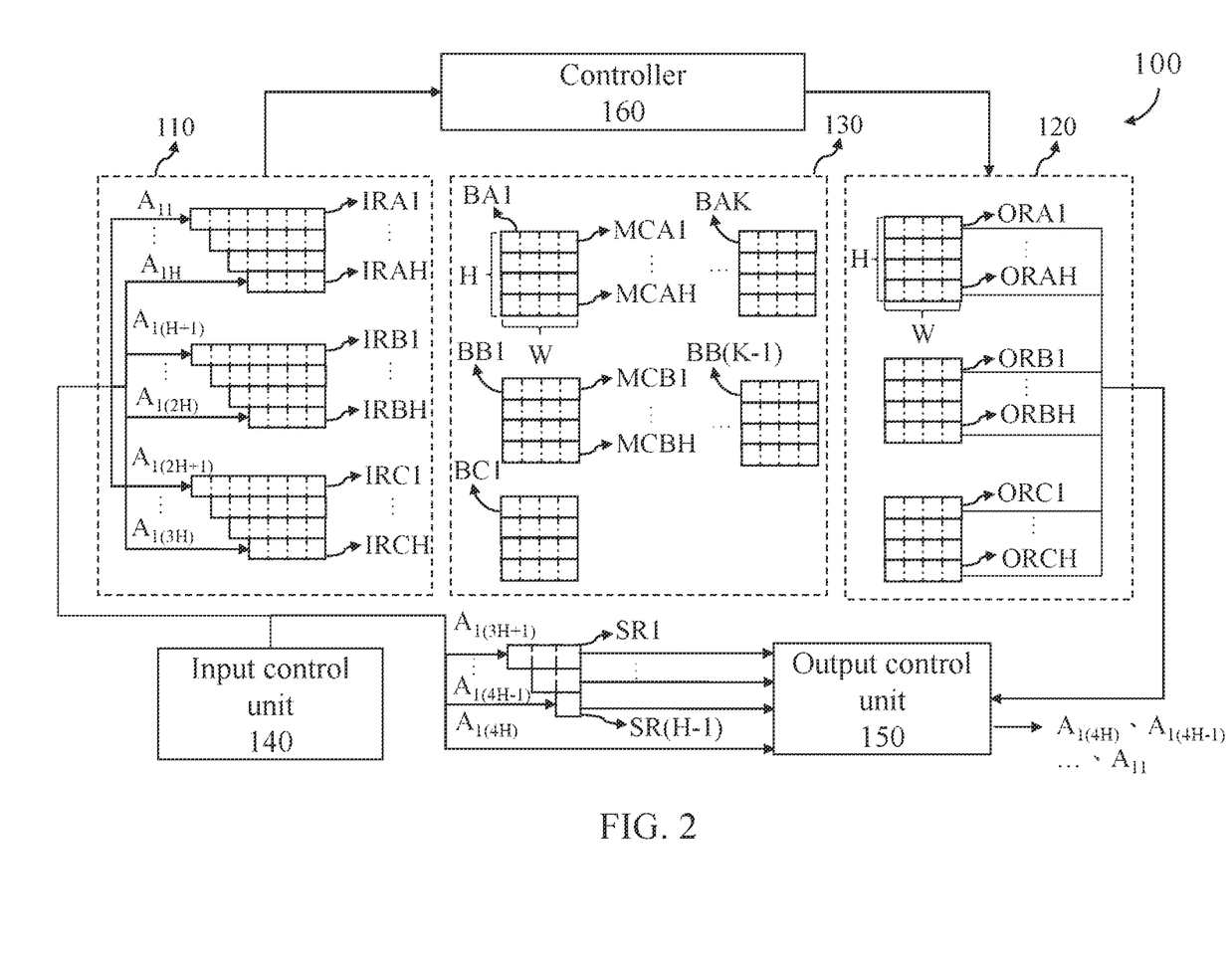
FIG. 2 is a schematic diagram illustrating a convolution time de-interleaver according to one embodiment of the present disclosure.

FIG. 2 is a schematic diagram illustrating a convolution time de-interleaver 100 according to one embodiment of the present disclosure. The convolution time de-interleaver 100 includes an input buffer 110, an output buffer 120, a memory 130, an input control unit 140, an output control unit 150, and a controller 160.

The input buffer 110 can include H input register unit groups IRA1 to IRAH, wherein H is an integer greater than 1, and each of the H first input register unit groups IRA1 to IRAH can include different quantities of first input register units to provide different lengths of delay. For example, the quantity of first input register units in the $h^{th}$ first input register unit groups is equal to the sum of W and H minus h, wherein H and W are integers greater than 1, and h is a positive integer less than or equal to H. In FIG. 2, H and W are both 4, in such case, the $1^{st}$ first input register unit group IRA1 can include 7 input register units, the $2^{nd}$ first input register unit group IRA2 can include 6 input register units, and the $3^{rd}$ first input register unit group IRA3 can include 4 input register units.

The output buffer 120 can include H first output register unit groups ORA1 to ORAH corresponding to the H first input register unit groups IRA1 to IRAH, wherein each of the first output register unit groups ORA1 to ORAH can include W first output register units. The memory 130 can include K first memory blocks BA1 to BAK, wherein K is a positive integer; in the present embodiment, K is 3. Each of the first memory blocks BA1 to BAK can include H first memory unit groups MCA1 to MCAH corresponding to the H first input register unit groups IRA1 to IRAH and the H first output register unit groups ORA1 to ORAH, and each of the first memory unit groups MCA1 to MCAH can include W first memory units.

In the present embodiment, each first output register unit, each first input register unit, and each first memory unit all have the same bit capacity, for example, but not limited to, 32 bits. Further, the bit capacity of each of the first memory blocks BA1 to BAK can be an integer multiple of the single read/write bandwidth of the memory 130, so as to ensure that the whole bandwidth of the memory 130 can be utilized efficiently every time when a read operation or a write operation is performed to the first memory blocks BA1 to BAK. For example, in the present embodiment, the single read/write bandwidth of the memory 130 is 256 bits; in such case, if both H and W are 4, the total bit capacity of the first memory block BA1 is 512 bits; that is, twice the single read/write bandwidth of the memory 130.

In the present embodiment, the memory 130 can be a double data rate synchronous dynamic random access memory (DDR SDRAM), and the H first memory unit groups in each of the first memory blocks BA1 to BAK can have consecutive addresses. Hence, the convolution time de-interleaver 100 can use the H first input register unit groups IRA1 to IRAH to store a certain amount of data temporarily, and then write multiple entries of data to the corresponding first memory blocks in the first memory blocks BA1 to BAK at one time; consequently, the read/write bandwidth of the memory 130 can be utilized efficiently, thereby avoiding the waste of the bandwidth by frequently writing a single entry of data to the memory 130. Moreover, in some embodiments, the memory 130 can further include a greater quantity of memory units that can be used by other circuits in the system, in such case, since the convolution time de-interleaver 100 can continuously write multiple entries of data at one time, it is feasible to avoid the memory 130 from being occupied by the convolution time de-interleaver 100 frequently, which may delay the operation of other circuits.

In some embodiments, to make sure that the convolution time de-interleaver 100 can efficiently move the data from the H first input register unit groups IRA1 to IRAH to the first memory blocks BA1 to BAK, the developer may first determine the value of H and W according to the read/write bandwidth of the memory 130 so as to set the size of the first memory blocks BA1 to BAK, and determine the quantity of register units in the input buffer 110 and the output buffer 120 correspondingly.

Further, in the present embodiment, the total bit capacity of the H first output register unit groups ORA1 to ORAH may be the same as the total bit capacity of each of the first memory blocks BA1 to BAK; for example, both total bit capacities can be W×H×32 bits. Therefore, when all the K first memory blocks BA1 to BAK of the memory 130 have been written with data, the data in the first memory block that has not been written with data for the longest time can be read at the same time and can be stored to the H first output register unit groups ORA1 to ORAH. In such case, the bandwidth waste caused by frequently writing a single entry of data to the memory 130 can be avoided.

Figure 3:
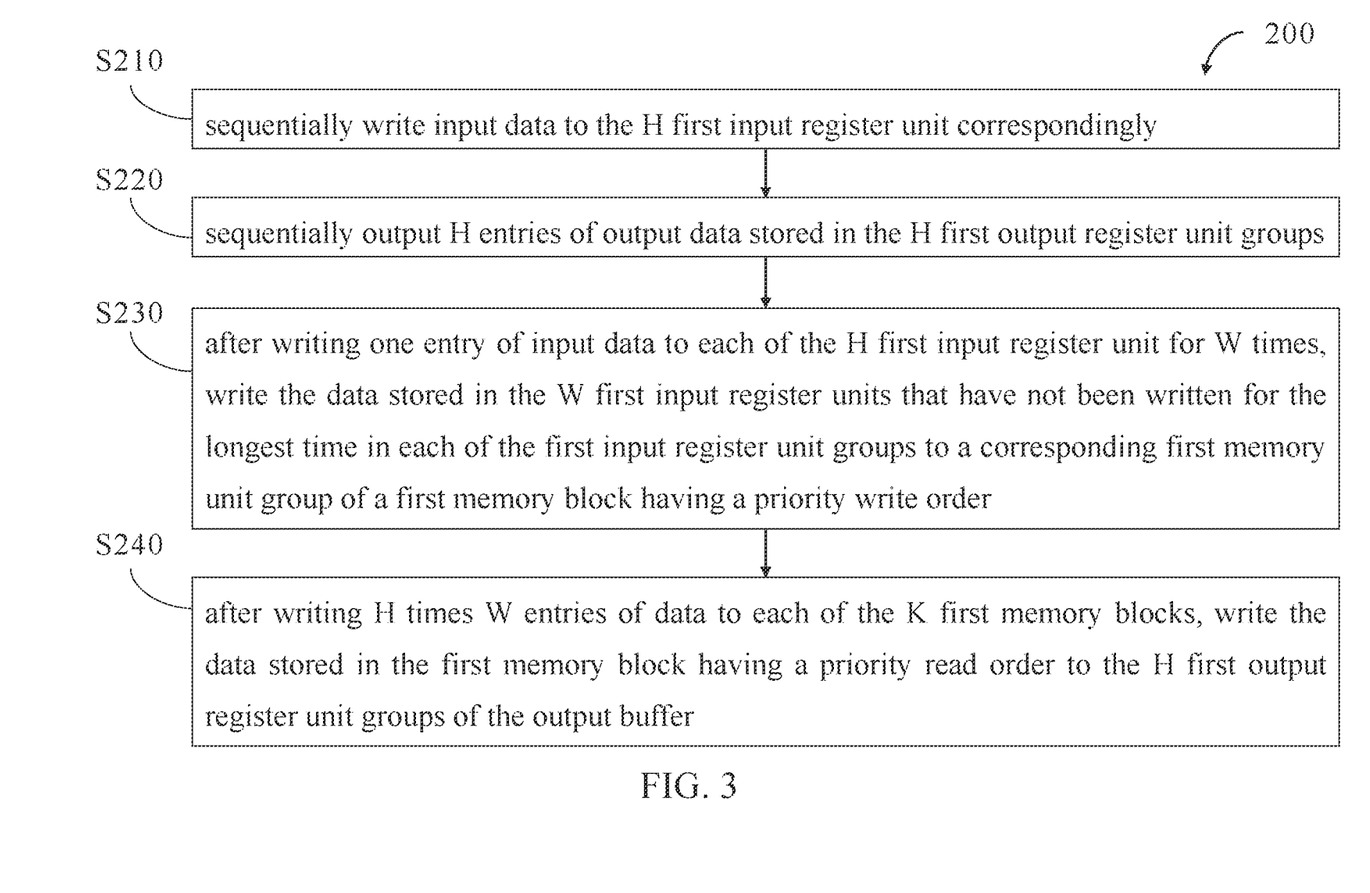
FIG. 3 is a flowchart illustrating a method for operating a convolution time de-interleaver according to one embodiment of the present disclosure.

FIG. 3 is a flowchart illustrating a method 200 for operating the convolution time de-interleaver 100 according to one embodiment of the present disclosure. The method 200 can include steps S210 to S240.

S210: sequentially write input data to the H first input register unit groups IRA1 to IRAH correspondingly;

S220: sequentially output H entries of output data stored in the H first output register unit groups ORA1 to ORAH;

S230: after writing one entry of input data to each of the H first input register unit groups IRA1 to IRAH for W times, write the data stored in the W first input register units that have not been written for the longest time in each of the first input register unit groups to a corresponding first memory unit group of a first memory block having a priority write order; and S240: after writing H times W entries of data to each of the K first memory blocks BA1 to BAK, write the data stored in the first memory block having a priority read order to the H first output register unit groups ORA1 to ORAH of the output buffer 120.

In Step S210, the input control unit 140 can sequentially and correspondingly write H entries of continuous input data $A_{11}$ to $A_{1H}$ to the H first input register unit groups IRA1 to IRAH. Moreover, when the H entries of input data $A_{11}$ to $A_{1H}$ are sequentially written to the H first input register unit groups IRA1 to IRAH, the output control unit 150 performs Step S220 simultaneously. In Step S220, the output control unit 150 can sequentially output the H entries of output data stored in the H first output register unit groups ORA1 to ORAH.

Figure 4:
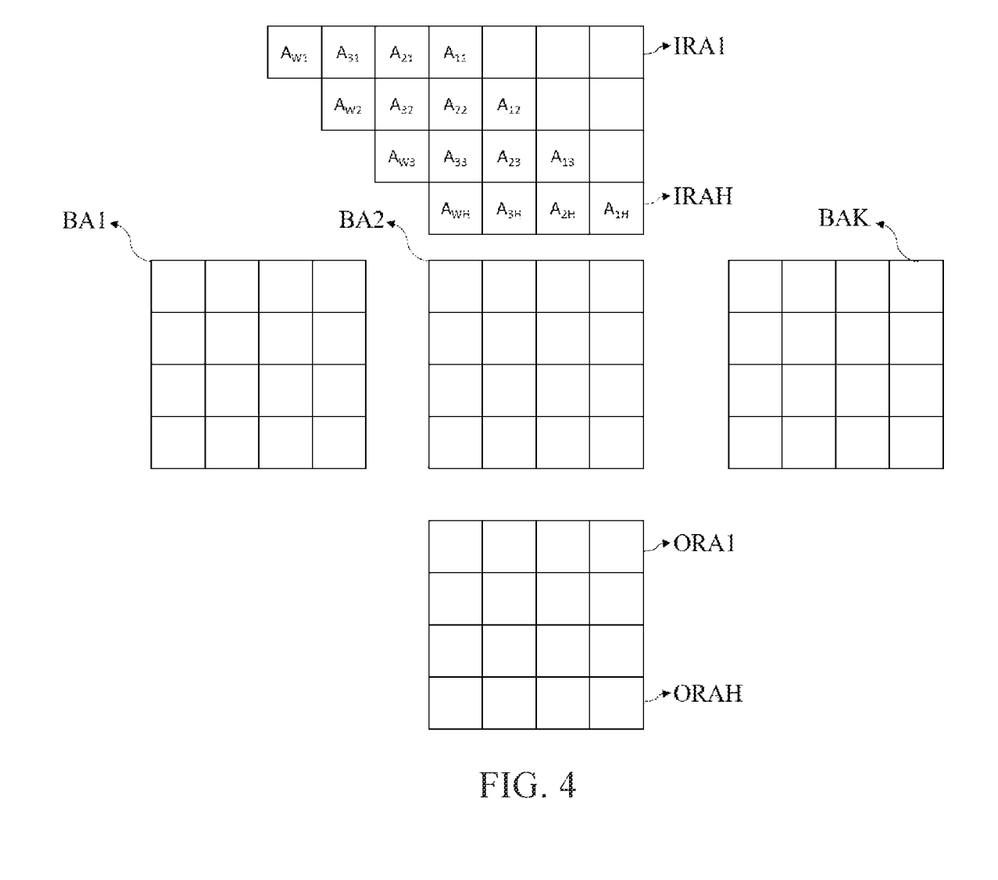
FIG. 4 to FIG. 8 are schematic diagrams illustrating the convolution time de-interleaver of FIG. 1 moving data under different stages.
Figure 5:
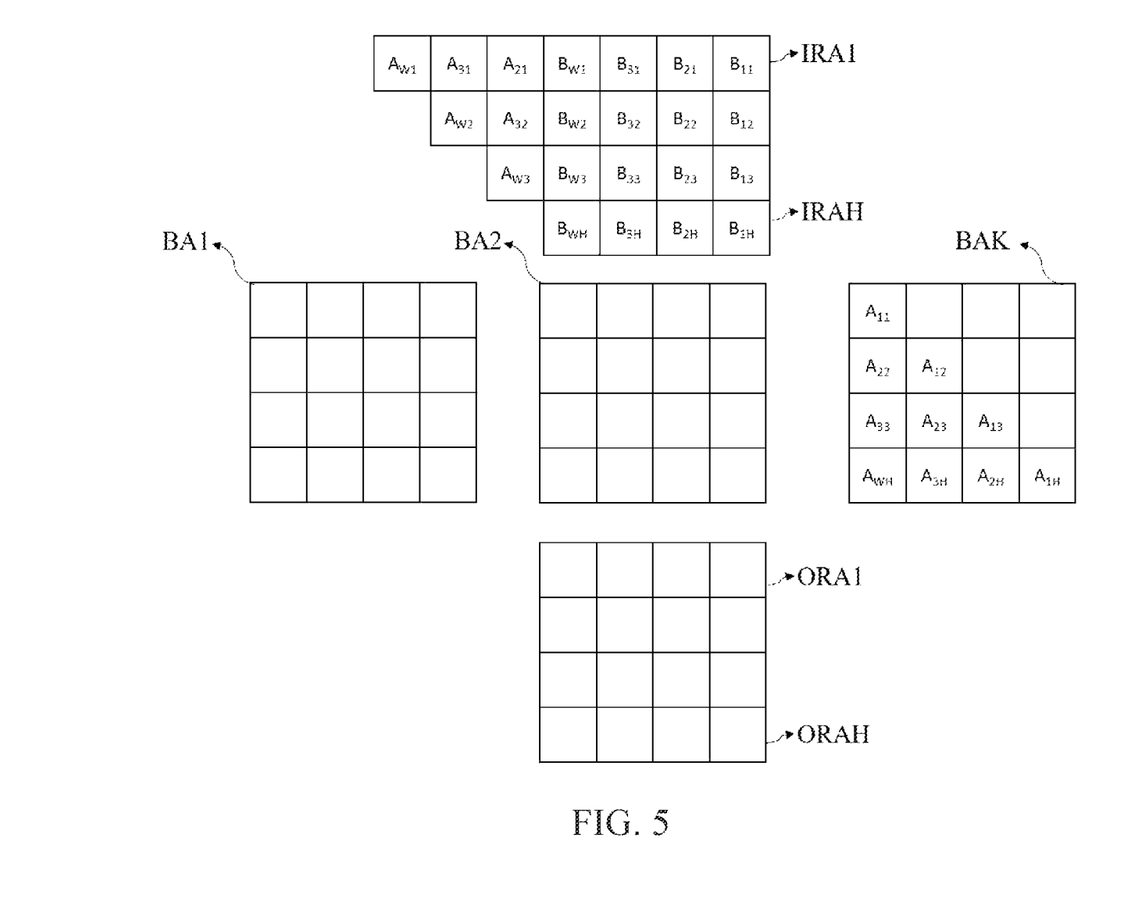

FIG. 4 to FIG. 8 are schematic diagrams illustrating that the convolution time de-interleaver 100 moves data in different stages. For the ease of discussion, in FIG. 4 to FIG. 8, both H and W are 4, and K is 3; however, in other embodiments of the present disclosure, H and W can be other integers greater than 1, and K can be other positive integers. In FIG. 4, the H first output register unit groups IRA1 to IRAH have been sequentially written with W entries of input data $A_{11}$ to $A_{W1}$, $A_{12}$ to $A_{W2}$, $A_{13}$ to $A_{W3}$, and $A_{1H}$ to $A_{WH}$. That is, the H first output register unit groups IRA1 to IRAH have stored therein the data volume that a first memory block BA1 can accommodate, and in such case, the controller 160 can perform Step S230 to write the data stored in the W first input register units that have not been written for the longest time in each of the first input register unit groups IRA1 to IRAH to a corresponding first memory unit group of a first memory block having a priority write order. In some embodiments, a first memory block that has not been written for the longest time in the first memory blocks BA1 to BAK may have a priority write order; however, when all the first memory blocks BA1 to BAK are not written, it is also feasible to determine which of the first memory blocks BA1 to BAK has the priority write order according to an order predetermined by the system. In FIG. 5, the first memory block BAK may have a priority write order, and hence the controller 160 will store the data stored in the W first input register units that have not been written for the longest time in each of the first input register unit groups IRA1 to IRAH to the first memory block BAK.

Moreover, in FIG. 5, the input control unit 140 can record the address of each input register unit in the H first input register unit groups IRA1 to IRAH and an order in which it is written with the data, and hence, when the input control unit 140 receives input data $B_{11}$ to $B_{W1}$, $B_{12}$ to $B_{W2}$, $B_{13}$ to $B_{W3}$, and $B_{1H}$ to $B_{WH}$, it can sequentially write the input data $B_{11}$ to $B_{W1}$, $B_{12}$ to $B_{W2}$, $B_{13}$ to $B_{W3}$, and $B_{1H}$ to $B_{WH}$ to the W input register units that have not been written for the longest time in each of the H first input register unit groups IRA1 to IRAH. At this time, the controller 160 will perform Step S230 one more time to write the data stored in the W first input register units that have not been written for the longest time in each of the first input register unit groups IRA1 to IRAH to a corresponding first memory unit group of a first memory block having a priority write order. In such case, if the first memory block BA2 has a priority write order, then the data stored in the W first input register units that have not been written for the longest time in each of the four first input register unit groups IRA1 to IRAH shown in FIG. 5 will be written to the first memory block BA2 as shown in FIG. 6.

Figure 6:
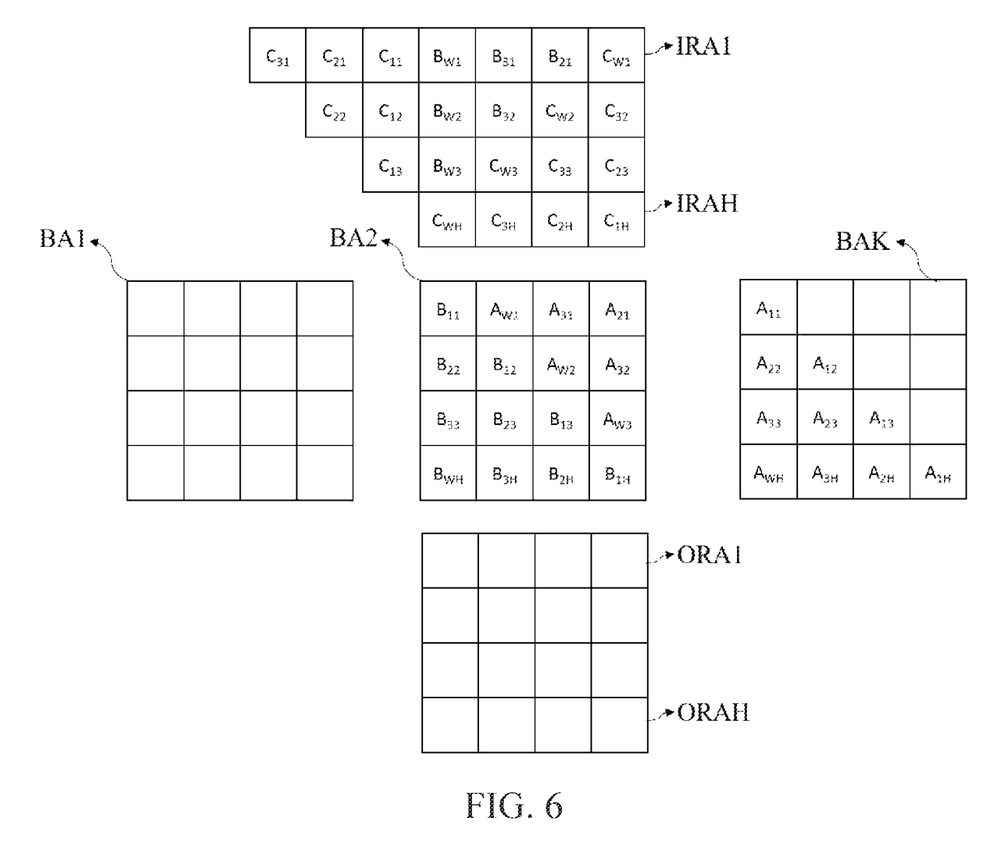
Figure 7:
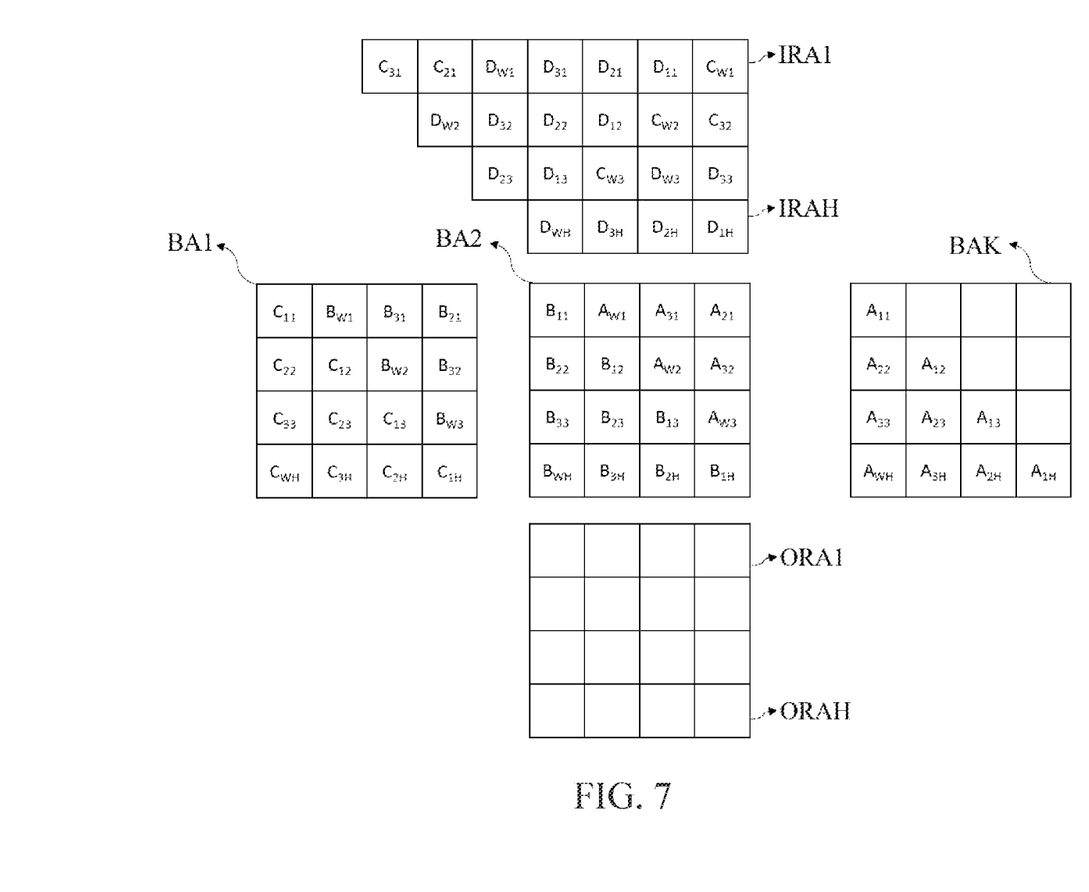

Moreover, in FIG. 6, the input control unit 140 has sequentially written the input data $C_{11}$ to $C_{W1}$, $C_{12}$ to $C_{W2}$, $C_{13}$ to $C_{W3}$, and $C_{1H}$ to $C_{WH}$ to the W input register units that have not been written for the longest time in each of the H first input register unit groups IRA1 to IRAH. In such case, the controller 160 will perform Step S230 once again to write the data stored in the W first input register units that have not been written for the longest time in each of the first input register unit groups IRA1 to IRAH to a corresponding first memory unit group of a first memory block having a priority write order. At this time, since the first memory block BA1 is the first memory block that has not been written for the longest time, it has a priority write order, and hence, the data stored in the W first input register units that have not been written for the longest time in the four first input register unit groups IRA1 to IRAH shown in FIG. 6 will be written to the first memory block BA1 as shown in FIG. 7. Further, in FIG. 7, since each of the first memory blocks BA1 to BAK has been written H times W entries of data, the controller 160 will perform Step S240 to write the data stored in the first memory block having the priority read order to the H first output register unit groups ORA1 to ORAH of the output buffer 120.

Figure 8:
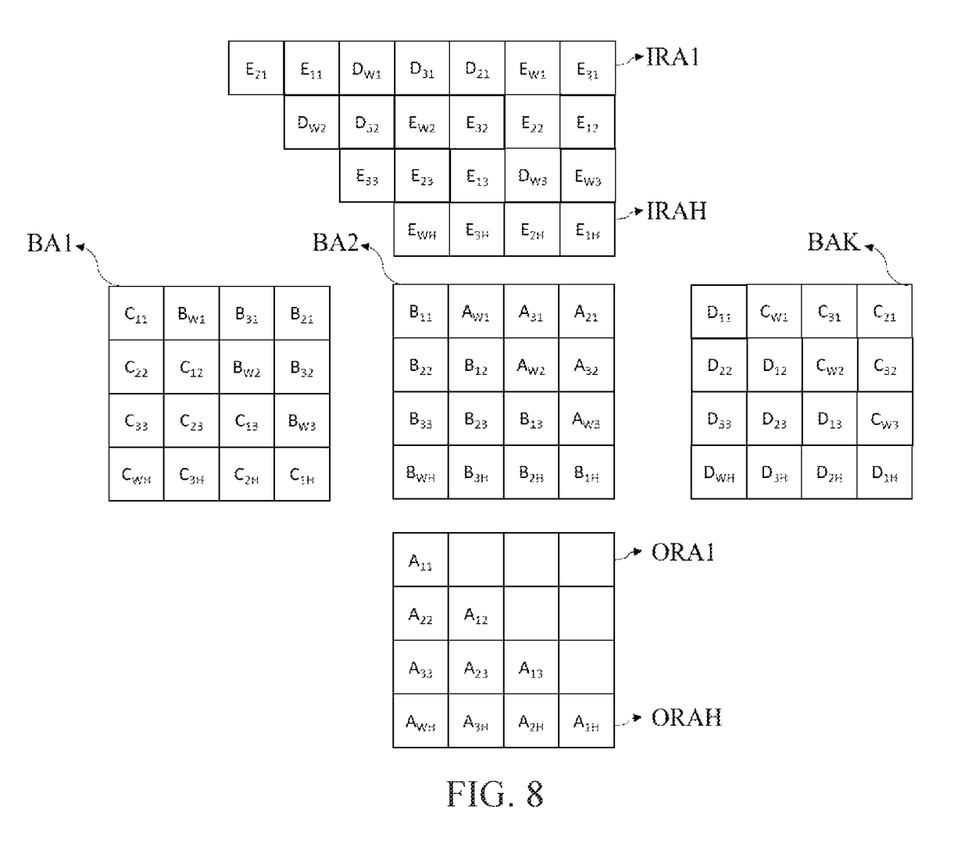

In the present embodiment, the first memory block that has not been written for the longest time in the first memory blocks BA1 to BAK will have a priority read order, and hence in FIG. 8, the controller 160 will write the data stored in the first memory block BAK to the H first output register unit groups ORA1 to ORAH. In the present embodiment, the controller 160 can write data to H first output register unit groups ORA1 to ORAH in a fixed order, and the output control unit 150 can also output the data in the H first output register unit groups ORA1 to ORAH in a fixed order. In the embodiment shown in FIG. 8, the output control unit 150 will sequentially output data $A_{1H}$, $A_{13}$, $A_{2H}$, $A_{12}$, $A_{23}$, $A_{3H}$, $A_{11}$, $A_{22}$, $A_{33}$, and $A_{WH}$.

Moreover, in FIG. 7, the input control unit 140 has sequentially written the input data $D_{11}$ to $D_{W1}$, $D_{12}$ to $D_{W2}$, $D_{13}$ to $D_{W3}$, and $D_{1H}$ to $D_{WH}$ to the W input register units that have not been written for the longest time in the H first input register unit groups IRA1 to IRAH, and hence, in FIG. 8, the controller 160 will perform Step S230 once again to write the data stored in the W first input register units that have not been written for the longest time in each of the first input register unit groups IRA1 to IRAH to a corresponding first memory unit group of the first memory block BAK currently having a priority write order. Moreover, in FIG. 8, the input control unit 140 will also sequentially write the input data $E_{11}$ to $E_{W1}$, $E_{12}$ to $E_{W2}$, $E_{13}$ to $E_{W3}$, and $E_{1H}$ to $E_{WH}$ to the W input register units that have not been written for the longest time in the H first input register unit groups IRA1 to IRAH and repeat the aforementioned steps.

Since each of the H first input register unit groups IRA1 to IRAH include different numbers of input register units, the data written to the H first input register unit groups IRA1 to IRAH will be outputted after being delayed for different lengths of time. Furthermore, although the process that the controller 160 writes a portion of data in the H first input register unit groups IRA1 to IRAH to the first memory blocks BA1 to BAK, may not cause any delay to the data input and output sequence of the convolution time de-interleaver 100, the quantity K of the first memory blocks BA1 to BAK can affect the length of the delay time because the convolution time de-interleaver 100 will only write the data stored in the first memory block that has not been written for the longest time to the H first output register unit groups ORA1 to ORAH after all the first memory blocks BA1 to BAK has been written with data. For example, if each time that one entry of data is written to each of the H first input register unit groups IRA1 to IRAH is referred to a cycle, then when W and H are 4 and K is 3, the H first input register unit groups IRA1 to IRAH can respectively provide 3 to 0 cycles of delay, and the first memory blocks BA1 to BAK can provide a further 12 cycles of delay. That is, the input data $A_{11}$ that is written to the first input register unit group IRA1 will be outputted by output control unit 150 after the $15^{th}$ cycle finishes, and the input data $A_{12}$ that is written to the first input register unit group IRA2 will be outputted by output control unit 150 after the $14^{th}$ cycle finishes, and so on.

Further, in the present embodiment, the input control unit 140 performs the write operation on the input register units according to the address of the H first input register unit groups IRA1 to IRAH, and hence, the present disclosure is not limited to storing data according to the arrangements of each of the first input register unit groups IRA1 to IRAH as shown in FIG. 4 to FIG. 8. In some other embodiments, as long as the input control unit 140 can record the address of each input register unit and the corresponding order in which it is written, the input control unit 140 can operate according to the method 200. Similarly, the controller 160 also performs the write operation on the memory units according to the address of the first memory blocks BA1 to BAK, and hence, the present disclosure is not limited to storing data according to the arrangements of each of the first memory blocks BA1 to BAK as shown in FIG. 4 to FIG. 8. In some other embodiments, as long as the input control unit 140 can record the address of each memory unit and the corresponding order in which it is written, the input control unit 140 can operate according to the method 200.

In FIG. 2, the input buffer 110 can further include H second input register unit groups IRB1 to IRBH, wherein the arrangement of the H second input register unit groups IRB1 to IRBH can be the same as that of the H first input register unit groups IRA1 to IRAH. For example, the quantity of second input register units in the $h^{th}$ second input register unit group IRBh is equal to the sum of W and H minus h. Moreover, the output buffer 120 can further include H second output register unit groups ORB1 to ORBH corresponding to the H second input register unit groups IRB1 to IRBH, and each of the second output register units ORB1 to ORBH can include W second output register units. Moreover, the memory 130 can further include (K−1) second memory blocks BB1 to BB(K−1), wherein each second memory block can include H second memory unit groups MCB1 to MCBH corresponding to the H second input register unit groups IRB1 to IRBH and the H second output register unit groups ORB1 to ORBH, and each of the second memory unit groups MCB1 to MCBH can include W second memory units.

In such case, after writing the H entries of input data $A_{11}$ to $A_{1H}$ to the H first input register unit groups IRA1 to IRAH, the method 200 can further use the input control unit 140 to sequentially write another H entries of input data $A_{1(H+1)}$ to $A_{1(2H)}$ to H second input register unit groups IRB1 to IRBH accordingly. Also, after outputting the H entries of output data stored in the H first output register unit groups ORA1 to ORAH, the method 200 can use the output control unit 150 to sequentially output the H entries of output data stored in the H second output register unit groups ORB1 to ORBH.

Moreover, after writing one entry of input data to each of the H second input register unit groups IRB1 to IRBH for W times, the method 200 can further use the controller 160 to write the data stored in the W second input register units that have not been written for the longest time in each of the second input register unit groups IRB1 to IRBH to a corresponding second memory unit group of a second memory block that has not been written for the longest time in the (K−1) second memory blocks BB1 to BB(K−1). Also, after writing H entries of data to each of the (K−1) second memory blocks BB1 to BB(K−1) for W times, the method 200 can further write the data stored in a second memory block that has not been written for the longest time in the (K−1) second memory blocks to the H second output register unit groups ORB1 to ORBH of the output buffer 120.

Consequently, the H second input register unit groups IRB1 to IRBH, the (K−1) second memory blocks BB1 to BB(K−1), and the H second output register unit groups ORB1 to ORBH can also provide different lengths of delay. For example, the input data $A_{11}$ to $A_{1H}$ that are written to the H first input register unit groups IRA1 to IRAH will be outputted by the output control unit 150 after being delayed for 15, 14, 13, and 12 cycles, and the input data $A_{1(H+1)}$ to $A_{1(2H)}$ that are written to the H second input register unit groups IRB1 to IRBH will be outputted by the output control unit 150 after being delayed for 11, 10, 9, and 8 cycles. That is, the convolution time de-interleaver 100 can include more input register unit groups in the input buffer 110 depending on the delay time that the system requires and include more corresponding memory blocks in the memory 130 and more corresponding output register units in the output buffer 120, so as to provide corresponding delay time. For example, the input buffer 110 can further include H third input register unit groups IRC1 to IRCH, the output buffer 120 can further include H third output register unit groups ORC1 to ORCH corresponding to the H third input register unit groups IRC1 to IRCH, and the memory 130 can further include a third memory block BC1. In such case, the input data $A_{1(2H+1)}$ to $A_{1(3H)}$ that are written to the H third input register unit groups IRC1 to IRCH will be outputted by the output control unit 150 after being delayed for 7, 6, 5, and 4 cycles.

Moreover, in the embodiment of FIG. 2, the convolution time de-interleaver 100 can further include (H−1) shift register unit groups SR1 to SR(H−1), and each of the shift register unit groups SR1 to SR(H−1) can include different numbers of shift register units to provide different lengths of delay. For example, the $i^{th}$ shift register unit groups can include (H−i) shift register units, wherein i is an integer less than or equal to (H−1), and H is an integer greater than 2. When H is 4, the first shift register unit group SR1 can include 3 shift register units, the second shift register unit group SR2 can include 2 shift register units, and the (H−1)$^{th}$ shift register unit group SR(H−1) can include 1 shift register units.

In such case, after writing one entry of input data to each of the H third input register unit groups IRC1 to IRCH, the method 200 can sequentially write another (H−1) entries of input data $A_{1(3H+1)}$ to $A_{1(4H-1)}$ to the (H−1) first shift register units in the (H−1) shift register unit groups SR1 to SR(H−1) correspondingly. Also, after outputting the H entries of data stored in the H third output register unit groups ORC to ORCH, the method 200 can sequentially output the (H−1) entries of output data stored in the (H−1) last shift register units of the (H−1) shift register unit groups SR1 to SR(H−1). Next, after writing (H−1) entries of input data $A_{1(3H+1)}$ to $A_{1(4H-1)}$ to the (H−1) first shift register units and outputting the (H−1) entries of output data stored in the (H−1) last shift register units, the input control unit 140 can directly transmit one entry of input data $A_{1(4H)}$ to the output control unit 150 without delay. That is, the input data $A_{1(3H+1)}$ to $A_{1(4H-1)}$ that are written to the (H−1) shift register unit groups SR1 to SR(H−1) will be outputted by the output control unit 150 after being delayed for 3, 2, and 1 cycle(s), and the input data $A_{1(4H)}$ will be directly outputted by the input control unit 140 and the output control unit 150 and without any delay.

As discussed above, when H and W are 4 and K is 3, the convolution time de-interleaver 100 shown in FIG. 2 can provide 16 different delays to de-interleave the input data. However, in other embodiments, the user may choose appropriate H, W and K values depending on the actual need to provide the delay effect that the system requires.

In summary, the convolution time de-interleaver and the method for operating the convolution time de-interleaver provided by the embodiments of the present application can use a memory, which has better hardware usage efficiency and lower cost, to store data and provide the required delay time for each data. Also, the input register units are used to store a certain amount of data temporarily so that multiple entries of data can be written to corresponding memory blocks of the memory at one time. Therefore, the convolution time de-interleaver and the method for operating the convolution time de-interleaver provided in the embodiments of the present application can utilize the read/write bandwidth of the memory more efficiently without wasting the bandwidth by frequently performing a single data writing operation to the memory.

What is claimed is:

1. A convolution time de-interleaver, comprising:
   an output buffer, comprising H first output register unit groups, each first output register unit group comprising W first output register units, wherein H and W are integers greater than 1;
   an input buffer, comprising H first input register unit groups corresponding to the H first output register unit groups, wherein a quantity of first input register units in an h$^{th}$ first input register unit group is equal to a sum of W and H minus h, and h is a positive integer less than or equal to H;
   a memory, comprising K first memory blocks, each first memory block comprising H first memory unit groups corresponding to the H first output register unit groups and the H first input register unit groups, and each first memory unit group comprising W first memory units, wherein K is a positive integer;
   an input control unit, configured to sequentially write H entries of input data to the H first input register unit groups correspondingly;
   an output control unit, configured to sequentially output H entries of output data stored in the H first output register unit groups; and
   a controller, configured to, after writing one entry of input data to each of the H first input register unit groups for W times, write data stored in W first input register units that have not been written for the longest time in each of the first input register unit groups to a corresponding first memory unit group of a first memory block having a priority write order; and, after writing H times W entries of data to each of the K first memory blocks, write data stored in a first memory block having a priority read order to the H first output register unit groups of the output buffer;
   wherein:
   each first output register unit, each first input register unit, and each first memory unit have a same bit capacity; and
   a bit capacity of each first memory block is an integer multiple of a single read/write bandwidth of the memory.

2. The convolution time de-interleaver of claim 1, wherein:
   the H first memory unit groups in each first memory block have consecutive addresses.

3. The convolution time de-interleaver of claim 1, wherein:
   the first memory block having the priority write order is a first memory block that has not been written for the longest time in the K first memory blocks.

4. The convolution time de-interleaver of claim 1, wherein:
   the first memory block having the priority read order is a first memory block that has not been written for the longest time in the K first memory blocks.

5. The convolution time de-interleaver of claim 1, wherein the memory is a double data rate synchronous dynamic random access memory (DDR SDRAM).

6. The convolution time de-interleaver of claim 1, wherein:
   the output buffer further comprises H second output register unit groups, each second output register unit group comprising W second output register units;
   the input buffer further comprises H second input register unit groups corresponding to the H second output register unit groups, wherein a quantity of second input register units in an h$^{th}$ second input register unit group is equal to a sum of W and H minus h; and
   the memory further comprises (K−1) second memory blocks, each second memory block comprising H second memory unit groups corresponding to the H second output register unit groups and H second input register unit groups, and each second memory unit group comprising W second memory units, wherein K is an integer greater than 1.

7. The convolution time de-interleaver of claim 6, wherein:
   the input control unit is configured to, after writing H entries of input data to the H first input register unit groups, sequentially write another H entries of input data to the H second input register unit groups correspondingly; and
   the output control unit is further configured to, after outputting H entries of output data stored in the H first output register unit groups, sequentially output H entries of output data stored in the H second output register unit groups.

8. The convolution time de-interleaver of claim 7, wherein:
the controller is further configured to, after writing one entry of input data to each of the H second input register unit groups for W times, write data stored in W second input register units that have not been written for the longest time in each second input register unit group to a corresponding second memory unit group of a second memory block that has not been written for the longest time in the (K−1) second memory blocks; and, after writing H times W entries of data to each of the (K−1) second memory blocks, write data stored in a second memory block that has not been written for the longest time in the (K−1) second memory blocks to the H second output register unit groups of the output buffer.

9. The convolution time de-interleaver of claim 6, further comprising:
(H−1) shift register unit groups, wherein an $i^{th}$ shift register unit group comprises (H−i) shift register units, and i is an integer less than or equal to (H−1);
wherein:
H is an integer greater than 2;
the input control unit is further configured to, after writing H entries of input data to the H second input register unit groups, sequentially write (H−1) entries of input data to (H−1) first shift register units in the (H−1) shift register unit groups correspondingly; and
the output control unit is further configured to, after outputting H entries of output data stored in the H second output register unit groups, sequentially output H entries of output data stored in (H−1) last shift register units in the (H−1) shift register unit groups.

10. The convolution time de-interleaver of claim 9, wherein:
the input control unit is further coupled to the output control unit, and the input control unit is further configured to, after sequentially writing the (H−1) entries of input data to the (H−1) first shift register units correspondingly, directly transmit another entry of input data to the output control unit for outputting.

11. A method for operating a convolution time de-interleaver, the convolution time de-interleaver comprising an output buffer, an input buffer, and a memory, the output buffer comprising H first output register unit groups, each first output register unit group comprising W first output register units, the input buffer comprising H first input register unit groups corresponding to the H first output register unit groups, a quantity of first input register units in an $h^{th}$ first input register unit group being equal to a sum of W and H minus h, and h is a positive integer less than or equal to H, the memory comprising K first memory blocks, each first memory block comprising H first memory unit groups corresponding to the H first output register unit groups and H first input register unit groups, and each first memory unit groups comprising W first memory units, wherein each first output register unit, each first input register unit, and each first memory unit have a same bit capacity, a bit capacity of each first memory block is an integer multiple of a single read/write bandwidth of the memory, H and W are integers greater than 1, K is a positive integer, and h is a positive integer less than or equal to H, the method comprising:

sequentially writing H entries of input data to the H first input register unit groups correspondingly;
when sequentially writing the H entries of input data to the H first input register unit groups correspondingly, sequentially outputting H entries of output data stored in the H first output register unit groups at the same time;
after writing one entry of input data to each of the H first input register unit groups for W times, writing data stored in W first input register units that have not been written for the longest time in each of the first input register unit groups to a corresponding first memory unit group of a first memory block having a priority write order; and
after writing H times W entries of data to each of the K first memory blocks, writing data stored in a first memory block having a priority read order to the H first output register unit groups of the output buffer.

12. The method of claim 11, wherein:
the H first memory unit groups in each first memory block have consecutive addresses.

13. The method of claim 11, wherein:
the first memory block having the priority write order is a first memory block that has not been written for the longest time in the K first memory blocks.

14. The method of claim 11, wherein:
the first memory block having the priority read order is a first memory block that has not been written for the longest time in the K first memory blocks.

15. The method of claim 11, wherein the memory is a double data rate synchronous dynamic random access memory (DDR SDRAM).

16. The method of claim 11, wherein:
the output buffer further comprises H second output register unit groups, each second output register unit groups comprising W second output register units;
the input buffer further comprises H second input register unit groups corresponding to the H second output register unit groups, wherein a quantity of second input register units in an $h^{th}$ second input register unit group is equal to a sum of W and H minus h; and
the memory further comprises (K−1) second memory blocks, each second memory block comprising H second memory unit groups corresponding to the H second output register unit groups and H second input register unit groups, and each second memory unit groups comprising W second memory units, wherein K is an integer greater than 1.

17. The method of claim 16, further comprising:
after writing H entries of input data to the H first input register unit groups, sequentially writing another H entries of input data to the H second input register unit groups correspondingly; and
after outputting H entries of output data stored in the H first output register unit groups, sequentially outputting H entries of output data stored in the H second output register unit groups.

18. The method of claim 17, further comprising:
after writing one entry of input data to each of the H second input register unit groups for W times, writing data stored in W second input register units that have not been written for the longest time in each second input register unit group to a corresponding second memory unit group of a second memory block that has not been written for the longest time in the (K−1) second memory blocks; and after writing H times W entries of data to each of the (K−1) second memory blocks, writing data stored in a second memory block that has not been written for the longest time in the (K−1) second memory blocks to the H second output register unit groups of the output buffer.

19. The method of claim 16, wherein the convolution time de-interleaver further comprises (H−1) shift register unit groups, wherein an $i^{th}$ shift register unit groups comprises (H−i) shift register units, i is an integer less than or equal to (H−1), and H is an integer greater than 2, the method further comprising:

after writing H entries of input data to the H second input register unit groups, sequentially writing (H−1) entries of input data to (H−1) first shift register units in the (H−1) shift register unit groups correspondingly; and after outputting H entries of output data stored in the H second output register unit groups, sequentially outputting H entries of output data stored in (H−1) last shift register units in the (H−1) shift register unit groups.

20. The method of claim 19, further comprising:

after writing the (H−1) entries of input data to the (H−1) first shift register units and outputting the (H−1) entries of output data stored in the (H−1) last shift register units, directly outputting one entry of input data.

\* \* \* \* \*